United States Patent [19]

Gerard et al.

[11] 4,246,547
[45] Jan. 20, 1981

[54] PHASE LOCKED LOOP FREQUENCY GENERATOR HAVING STORED SELECTABLE DIVIDING FACTORS

[75] Inventors: Roger E. J. Gerard; Boleslaw M. Sosin, both of Chelmsford, England

[73] Assignee: The Marconi Company Limited, Chelmsford, England

[21] Appl. No.: 939,686

[22] Filed: Sep. 5, 1978

[30] Foreign Application Priority Data

Sep. 7, 1977 [GB] United Kingdom ............... 37256/77

[51] Int. Cl.³ .............................................. H03L 7/18
[52] U.S. Cl. ...................................... 331/16; 331/17; 331/25
[58] Field of Search ................... 331/16, 1 A, 17, 18, 331/25

[56] References Cited

U.S. PATENT DOCUMENTS

| | | | |
|---|---|---|---|
| 3,448,401 | 6/1969 | Welch, Jr. | 331/16 |
| 3,713,040 | 1/1973 | Page, Jr. | 331/16 |
| 3,872,397 | 3/1975 | Hanneman | 331/1 A |
| 3,928,813 | 12/1975 | Kingsford-Smith | 331/1 A |
| 4,078,213 | 3/1978 | Campioni | 331/1 A |
| 4,107,612 | 8/1978 | Leveque | 331/18 X |

FOREIGN PATENT DOCUMENTS 1113843   5/1968   United Kingdom ...................... 331/16

Primary Examiner—Siegfried H. Grimm
Attorney, Agent, or Firm—Diller, Ramik & Wight

[57] ABSTRACT

A frequency generator provides a number of selectable predetermined spot frequencies to a high degree of accuracy in an economical manner. The output from a phase lock loop having a variable frequency divider is divided by a further variable frequency divider. The two dividers are controlled by pairs of divisor values held in a store.

2 Claims, 1 Drawing Figure

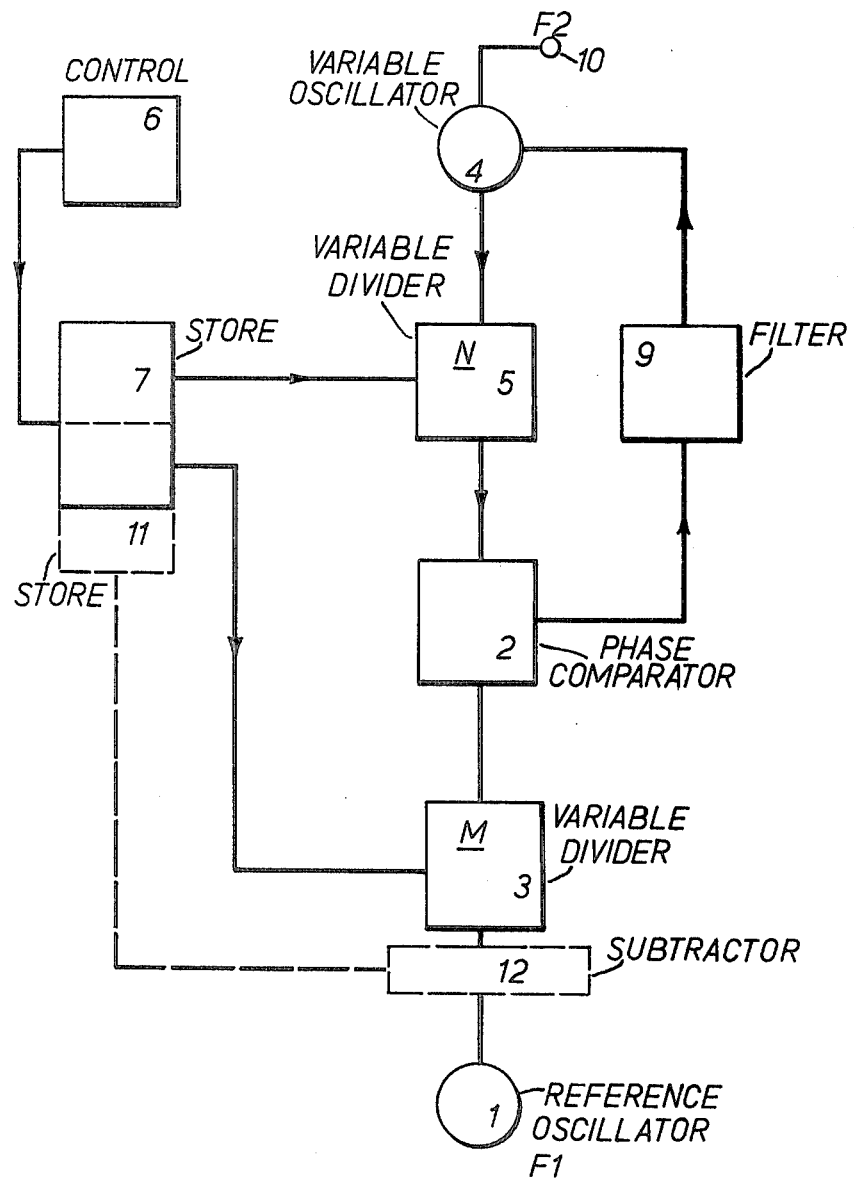

PHASE LOCKED LOOP FREQUENCY GENERATOR HAVING STORED SELECTABLE DIVIDING FACTORS

This invention relates to frequency generators and seeks to provide, in an economical manner, a generator in which one of a number of predetermined frequency values can be readily selected.

According to this invention, a frequency generator includes a variable frequency output oscillator; a comparator arranged to receive, via a first variable frequency divider, a first signal derived from the output oscillator; the comparator also being arranged to receive via a second variable frequency divider a second signal derived from a reference oscillator, the frequency of said output oscillator being controlled by a signal derived from the comparator in dependence on said first and second signals; means for storing a pluraltiy of selected predetermined divisor values and means for setting said first and second variable frequency dividers in accordance with selected divisor values.

Preferably, said comparator is a combined frequency and phase comparator connected in a phase lock loop so as to adjust the frequency of the output oscillator until the phases of the first and second signals are in agreement. Preferably again, a control circuit is provided and which is arranged to select predetermined pairs of divisor values from a store to set the divisor values of the first and second dividers respectively.

Preferably, a low pass filter is provided between the output of the comparator and the output oscillator.

In contrast with conventional phase locked loop systems, although the output frequency is directly locked to a reference frequency, the resultant frequency produced in general is not an integral number of Hz, and may in some cases have a frequency error of several Hz relative to the desired value. In instances where a small error is acceptable, this system provides a cost effective solution. Long term accuracy is dependent on the reference oscillator.

Only predetermined output frequency values can be obtained in dependence on the value of the reference frequency, since the divisor provided by each divider is an integer. It is, therefore, preferably to provide means for modifying the reference frequency by a small offset value to allow output frequencies to be provided which could not otherwise be obtained by selection of particular divisor values.

One or more offset frequencies may be used.

The invention is further described, by way of example, with reference to the accompanying drawing which illustrates in diagrammatic form a frequency generator in accordance with the present invention.

Referring to the drawing, there is provided a reference oscillator 1, the output of which is passed to a phase comparator 2 via a variable frequency divider 3. The phase comparator also receives a signal provided by a variable output oscillator 4 via a further variable frequency divider 5. The phase comparator 2 provides an output signal which is fed via a low pass filter 9 to control the frequency of the variable oscillator 4 so as to modify its frequency value until the two signals received by the phase comparator are in exact agreement. Exact agreement is achieved only when both signals have the same frequency and phase relationship. The divisor values of the variable frequency dividers 3 and 5 are determined by a control circuit 6 by means of which appropriate pairs of divisor values can be selected from a store 7. Typically, the control circuit 6 could comprise a small keyboard under the manual control of an operator. The keyboard would have a relatively small number of individual push buttons, possibly not more than ten, arranged such that depression of a particular push button selects a pair of divisor values from the store 7 in accordance with a desired value of output frequency. The use of ten push buttons allows ten separate frequencies to be selected, the values of which are predetermined by the twenty divisor values held in the store 7.

The values of divisors forming the ratio N/M which give acceptable small frequency errors to the wanted frequency would be computed externally, prior to being written in the store. Any known form of store per se could be employed, electrical or mechanical. Conveniently, it could comprise a read-only memory.

If M and N are respectively the divisor values of the variable frequency dividers 3 and 5, the output frequency F2 provided by the variable frequency oscillator 4 is given by:

$$F2 = (N/M) \times F1,$$

where F1 is the frequency of the reference oscillator 1.

Depending on the selected values of M and N, the value of F2 is not necessarily an integral number of cycles per second, but in general will be fractional. Thus, it may not be possible to exactly obtain a required frequency, but by careful choice of F1, M and N, the difference frequency, or error, can be made acceptably small for many applications. This point is further explained in connection with the following table in which F1=70MHz and an output frequency of 98.123456MHz is required. Restricting the values of M and N to the range of 3,500 to 10,000 the following ratios give reasonably small errors.

| M | N | F out (Hz) | Error (Hz) |
| --- | --- | --- | --- |
| 4423 | 6200 | 98,123,445.63 | −10.37 |
| 3629 | 5087 | 98,123,449.97 | −6.03 |
| 6464 | 9061 | 98,123,452.98 | −3.02 |
| 5670 | 7948 | 98,123,456.76 | +0.76* |
| 4876 | 6835 | 98,123,461.87 | +5.87 |
| 6917 | 9696 | 98,123,463.90 | +7.90 |

From the table it will be seen that the smallest error* is obtained for values of M=5670 and N=7948. It is clear that a very large number of possible combinations of M and N exist, and that a very large store 7 would be required to hold all possible pairs of values or even a large proportion of them. In practice, however, the frequency generator is intended to be used where a relatively small number of predetermined frequency values are required very rapidly on selection, at low cost. Accordingly, typically only ten values need be stored in the store 7, as already mentioned, and these ten values can be very readily accessed by a simple control circuit 6. It will, thus, be seen that a number of predetermined frequencies can be provided in a relatively simple and economical way. By choosing the value of M so as to apply a relatively high frequency to the phase comparator 2, a rapid response time of the phase lock loop can be achieved. A rapid response time can be a very important consideration for certain applications. For example, the present invention is particularly suitable for use with broadcast transmitters. For such an application, only a relatively few number of broadcast frequencies will be required and the values of F1 and the stored divisor values M and N can be chosen with the possible broadcast carrier frequencies in mind.

When the frequency error in the system, as described above, is larger than can be tolerated for specific applications, the frequency generator can be modified as shown in broken line on the drawing. A further store 11 and a subtractor 12 are used to modify the value of the reference frequency F1 by an amount, typically about 100Hz, which is large compared to the tolerated error and hence readily achievable. Conveniently, the subtractor 12 is a known form of digital subtractor, but the offset reference frequency can be achieved in other known ways, for example, by using an analogue mixer or a subtracting phase lock loop. In this case, the store 11 (which could be merely a particular location in the existing store 7) holds data relating to the one or more required frequency offset values, and is addressed as necessary by the control circuit 6 in dependence on the selected value of the output frequency F2.

By suitable choice of an offset frequency, it is possible to obtain a selectable range of output frequencies in which the size of 'gaps' between adjacent frequency values achievable is much reduced as compared with the unmodified frequency generator.

We claim:

1. A frequency generator comprising, in combination: variable frequency oscillator means for producing a frequency controlled output; and control means for controlling said variable frequency oscillator means for causing the frequency of the output thereof to switch among a finite number of fixed, discrete frequencies $F_2$ which correspond, with small errors, to desired frequencies F; said control means comprising a reference oscillator having a relatively stable output $F_1$; comparator means having an output connected to said variable oscillator means and first and second inputs derived respectively from the output signals of said variable frequency oscillator means and said reference oscillator for producing a number, equal to said finite number, of discrete outputs $F_2 = F_1 N/M$ at the output of said variable frequency oscillator means; first variable frequency divider means for dividing the frequency of said variable frequency oscillator by the divisor value N to provide said first input to said comparator means; second variable frequency divider means dividing the frequency of said reference oscillator by the divisor value M to provide said second input to said comparator means; storage means for storing a number, equal to said finite number, of pairs of said divisor values N and M, the values of N and M for each of which pairs being different and selected to produce a particular one of said discrete outputs $F_2$ from said variable frequency oscillator means which approximates, with small error, a corresponding desired frequency F; selector means for selecting which pair of said stored divisor values is applied respectively to said first and second variable frequency divider means whereby said variable frequency oscillator means economically produces an output whose frequency is determined by the selected pair of divisor values and approximates a desired frequency; said first variable frequency divider means including variable frequency offset means; said storage means storing at least on value of frequency offset; and said selector means being capable of selecting said stored value of frequency offset for application to said offset means.

2. A frequency generator as defined in claim 1 wherein said comparator means is a phase lock loop and the output frequency $F_1$ of said reference oscillator is close to said frequency $F_2$ whereby the frequency of said first input to the phase lock loop as well as the frequency of the second output is relatively high to assure rapid response time of the phase lock loop.

* * * * *

UNITED STATES PATENT AND TRADEMARK OFFICE
CERTIFICATE OF CORRECTION

PATENT NO. : 4,246,547
DATED : Jan. 20, 1981
INVENTOR(S) : Roger E.J. Gerard

It is certified that error appears in the above—identified patent and that said Letters Patent are hereby corrected as shown below:

Column 4, line 27, change "first" to ---second---;

line 29, change "on" to ---one---.

Signed and Sealed this

Twelfth Day of January 1982

[SEAL]

Attest:

Attesting Officer

GERALD J. MOSSINGHOFF

Commissioner of Patents and Trademarks